United States Patent [19]
Dent et al.

[11] Patent Number: 5,910,182
[45] Date of Patent: Jun. 8, 1999

[54] DATA COMMUNICATIONS SYSTEMS AND METHODS USING INTERSPERSED ERROR DETECTION BITS

[75] Inventors: Paul W. Dent, Pittsboro; Rajaram Ramesh, Cary, both of N.C.

[73] Assignee: Ericsson Inc., Research Triangle Park, N.C.

[21] Appl. No.: 08/642,056

[22] Filed: May 3, 1996

[51] Int. Cl.[6] .................................................. G06F 11/10
[52] U.S. Cl. ...................... 714/786; 714/794; 714/755
[58] Field of Search ................................. 371/43.1, 37.4, 371/37.7, 43.6

[56] References Cited

U.S. PATENT DOCUMENTS

| | | | |
|---|---|---|---|
| 5,349,589 | 9/1994 | Chennakeshu et al. | 371/43 |
| 5,577,053 | 11/1996 | Dent | 371/37.4 |

FOREIGN PATENT DOCUMENTS

| | | |
|---|---|---|
| 0 422 560 A1 | 10/1990 | European Pat. Off. . |
| 422 560 A1 | 10/1990 | European Pat. Off. . |
| 0 730 356 A2 | 4/1996 | European Pat. Off. . |
| 2 252 702 | 8/1992 | United Kingdom . |

OTHER PUBLICATIONS

O. Collins, Determinate State Convolutional Codes, *IEEE Transactions on Communications*, vol. 41, No. 12 (Dec. 1993).

G. Clarke, Jr., *Error–Correction Coding for Digital Communications*, Appendix B. Plenum Press, New York (1981).

D. Forney, The Viterbi Algorith, *Proc. IEEE*, vol. 61, pp. 268–278 (Mar. 1973).

*Primary Examiner*—Reba I. Elmore
*Assistant Examiner*—McDieunel Marc
*Attorney, Agent, or Firm*—Myers Bigel Sibley & Sajovec, P.A.

[57] ABSTRACT

A communication system and method for communicating data bits includes generating error detection bits for interspersing within a sequence of data bits to be transmitted to provide a message to be transmitted. The interspersed data bits may be dependent on the data bits or determined independent of the data bits. The message to be transmitted is convolutionally encoded and transmitted through a communications medium. The received message is convolutionally decoded by a convolutional decoder which is operably connected to an error indication logic circuit. The interspersed error detection bits may be used to detect an uncorrected error in transmission or to constrain the convolutionally decoding to provide an improved error correction operation based on the determinate values of the interspersed error detection bits.

17 Claims, 7 Drawing Sheets

FIG. 8

DATA COMMUNICATIONS SYSTEMS AND METHODS USING INTERSPERSED ERROR DETECTION BITS

FIELD OF THE INVENTION

The present invention relates to a encoding and decoding systems and methods for use in signal communications, and in particular, to systems and methods for encoding and decoding data messages transmitted using both error detection and error correction coding.

BACKGROUND OF THE INVENTION

In data transmission over communication channels that are prone to errors, such as radio channels, error detection coding and/or error correction coding may be employed to reduce the errors in the data transmitted. The data transmitted is often digital information, which includes messages composed of binary bits of information, where each bit can have a value of either a ONE or a ZERO. Any given message is then a string comprising a number of ONES interspersed with a number of ZEROES. It will be appreciated that any string of L bits can represent one of $2^L$ unique messages. The messages may represent digitized voice information or some other form of information.

Error detection coding and error correction coding may both be used in communication systems. A simple example of error detection coding is adding an identical copy of a message to that message, transmitting both, and performing a bit-by-bit comparison of the received message with the received copy. For each bit position, any disagreement between the message and a copy is evidence of a transmission error. The total number of disagreements for a message is a quantitative measure of the reliability of the data transmission. It will be appreciated that the total number of disagreements is an inexact measure of reliability because simultaneous errors at the same bit position in both the message and the copy are not recognized as disagreements.

A common error detection technique, the Cyclic Redundancy Check (CRC) technique, generates and adds to the message "check" bits that are determined based on the bits of the data message. The check bits constitute a "checkword" that is specific to a given message. The checkword may be appended to the message so that both are processed through the same encoder, both are transmitted through the communication channel together, and both are processed through the same decoder in the receiver. A CRC calculator in the receiver may then generate check bits corresponding to the decoded message bits that were received, and this receiver-calculated checkword may be compared with the decoded checkword that was received with the message. Any noncompliance indicates an error detected in transmission, and the degree of compliance may be used as a quantitative measure of the reliability of the data transmission. However, a problem with this error detection method in systems also using error correction coding is that the received message must complete error correction decoding before the error detection coding can be tested.

By way of contrast, a simple example of error correction coding is transmitting more than two identical copies of a given message and performing a bit-by-bit comparison of all messages received at the receiver. Whether a bit of the message output from the receiver should be a ONE or a ZERO may be decided on the basis of "bit democracy", i.e., the majority of the bit values received for that bit position determines the output. Transmission errors may be assumed to be randomly distributed among the message copies and will thus typically not occur at the same bit position in a majority of the copies.

A known error correction technique is convolutional coding, in which the bits transmitted, known as parity bits, are determined based on the message bits. The message bits are considered L bits at a time, and r parity bits are transmitted for every L message bits. For example, the parity bits may be calculated as certain Boolean combinations of various bits of the message. The transmission of convolutionally encoded parity bits distinguishes convolutional coding generally from alternative coding schemes such as, for example, block coding, in which a small number of message bits is converted to a redundant block codeword and several such block codewords are transmitted to convey the whole message. A general description of known convolutional coding techniques is given below as an aid to understanding the background of the present invention.

Figure 1:
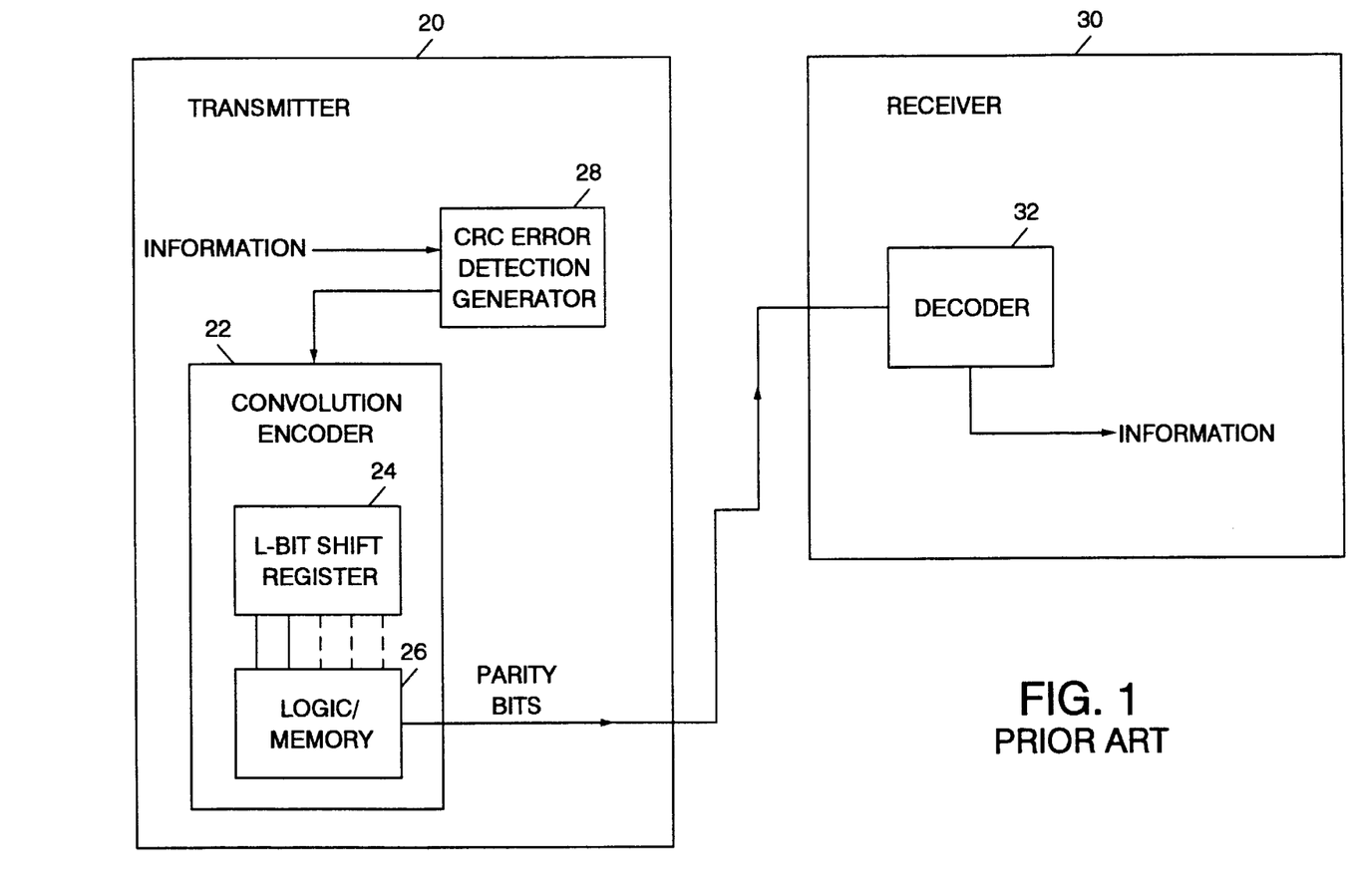
FIG. 1 is a block diagram of a conventional communication system incorporating a convolutional error correction encoding and CRC error detection.

An example of convolutional coding will now be discussed in connection with FIG. 1. Illustrated in FIG. 1 is a transmitter 20 having a convolutional encoder 22 consisting of a shift register 24 through which bits of information to be encoded are shifted. The shift register holds a limited number L of bits, the number L being known as the constraint length of the code because the code is constrained to be considered L bits at a time. At any instant, the bits in the shift register 24, which may be labeled $B_1, B_2, B_3, B_4, \ldots, B_L$, are applied to a combinatorial logic network 26 that generates two or more different Boolean combinations of the bits. As illustrated by FIG. 1, the bits in the shift register 24 may be provided by a CRC error detection generator 28 that receives message information to be transmitted and that generates and appends to the message check bits as described above.

The combinations generated by the network 26 are the parity bits, which are described above and which may be designated $P_1, P_2, \ldots, P_r$. The parity bits are transmitted over a communication channel to a receiver 30 having a decoder 32 that converts them back into the data bits $B_1, B_2, B_3, B_4, \ldots, B_L$, and eventually the message information that was transmitted.

It is to be understood that combinatorial logic network 26 as shown in FIG. 1, may alternatively be implemented as a look-up table comprising $2^L$ entries stored in a conventional memory. The patterns of the L-bit shift register 24 contents $B_1, B_2, B_3, B_4, \ldots, B_L$ would then address respective entries in the look-up table, which produces the characteristic sets of parity bits $P_1, P_2, \ldots, P_r$. The Boolean combinations of the patterns of the bits in the shift register 24 are thus stored in the look-up table rather than generated by the logic network.

If two parity bits are generated for each shift of the bits through the shift register 24, the code is known as a rate ½ code, with twice as many parity bits as original data bits being transmitted. If the rate of transmission is fixed, the time required to transmit such parity bits is twice as long as the time required to transmit the original data bits. More generally, if r parity bits are generated on every shift, the code is known as a rate 1/r code. Typically, the parity bit transmission rate is adopted to be r times the message information bit rate.

For example, the Boolean combination equations for generating the parity bits of a rate ½ code having a constraint length of five might be:

$P_1 = B_1 + B_2 + B_3 + B_4 + B_5$ $P_2 = B_1 + B_4 + B_5$ where "+" represents modulo-2 addition. It will be recognized that modulo-2 addition is logically equivalent to the exclusive-OR operation because 0+0 =0; 0 +1= 1+0=1; and 1+1=0.

As noted above, r times more parity bits than input data bits are produced for a rate 1/r code, and, if all parity bits are transmitted, an r-times redundancy has been provided to combat errors. It will, however, be appreciated that it is not necessary to transmit all of the parity bits. If the transmitter and receiver have previously agreed on some regular method of determining which parity bits are not transmitted, the code is then known as a punctured convolutional code. Punctured codes typically result in coding rates m/r, such as 13/29, where adaptation to a transmission rate that is r/m times the message information bit rate is required.

Tables of parity equations for various code rates and constraint lengths that result in optimum codes are published in the technical literature. See, e.g., G. Clarke, Jr., and J. Cain, *Error-Correction Coding for Digital Communications*, Appendix B, Plenum Press, New York (1981).

The known methods for decoding convolutional codes include threshold decoding, Sequential Maximum Likelihood Sequence Estimation (SMLSE), and the stack algorithm. The SMLSE technique is commonly known as the Viterbi algorithm, which is described in the literature including D. Forney, "The Viterbi Algorithm", Proc. IEEE, Vol. 61, pp. 268–278 (Mar., 1973). A description of decoding methods may be found in the Clarke and Cain text cited above.

Figure 2:
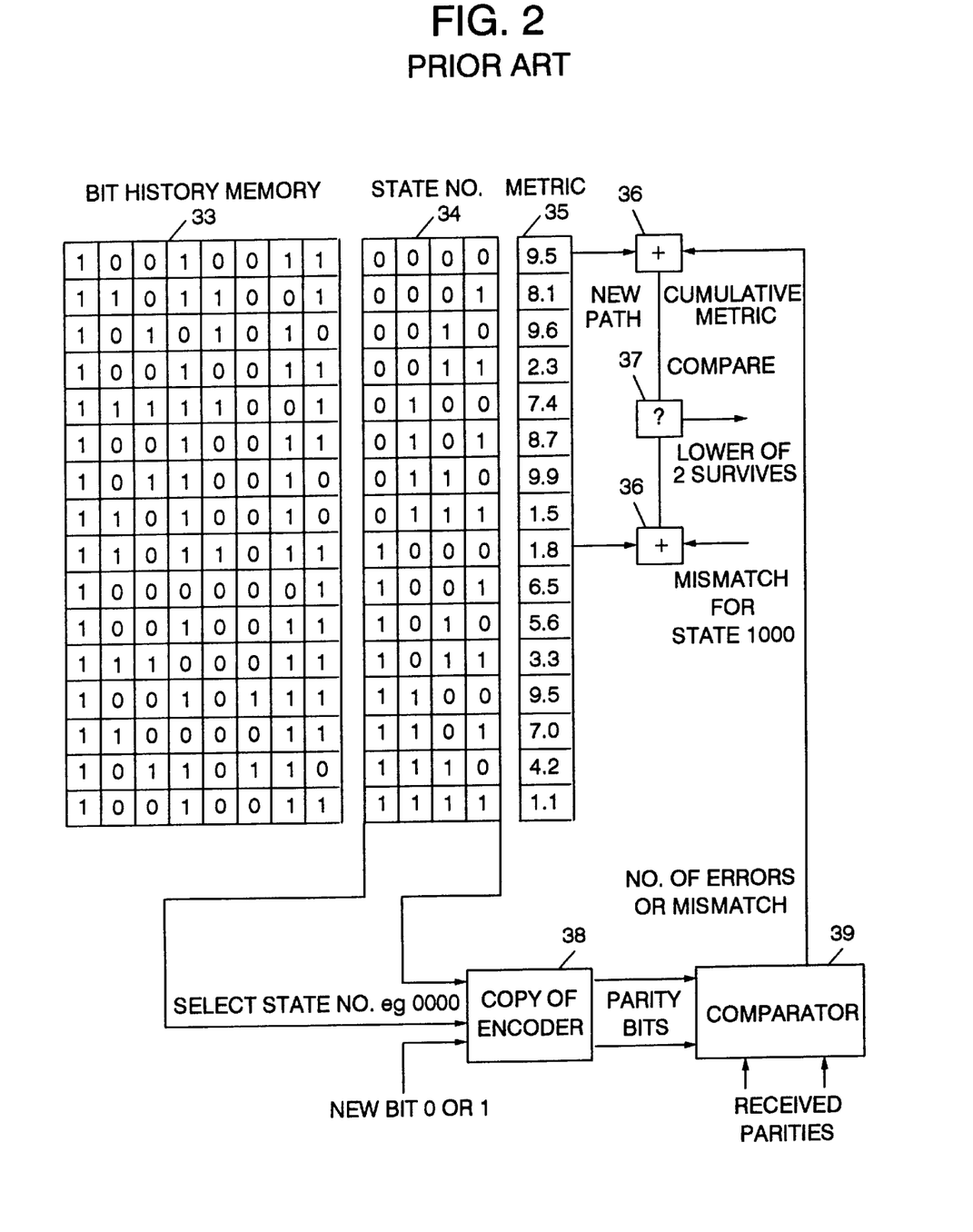
FIG. 2 is a block diagram of an example of a convolutional decoding algorithm.

The operation of an SMLSE convolutional decoding algorithm is illustrated by FIG. 2 for a rate ½ code having a constraint length of five. In the SMLSE decoder, a plurality of electronic storage elements 33, 34, 35 are arranged in groups called states, and the number of states is $2^{L-1}$, where L is the constraint length of the code to be decoded. The storage elements hold at least two different types of information, i.e., bit histories in elements 33 and path metrics in elements 34 associated with the states. In addition, state numbers associated with the states may be stored in elements 34 as binary bit patterns-of L--1 bits each.

A path metric may be considered a confidence factor representing the degree of correlation between a postulated bit sequence and an actual (e.g., received) bit sequence. To the extent that the postulated and actual bit sequences agree, the path metric is smaller and the confidence associated with that postulated bit sequence is greater. It will be understood that "postulated bit sequence", or simply "postulate", refers generally to any hypothetical bit sequence having some probability of being the actual bit sequence of interest. A postulate thus can represent message information bits, parity bits, or other codewords.

An important part of most SMLSE decoders is a "copy" 38 of the encoding algorithm. For the example communication system depicted in FIG. 1, the copy 38 could be an L-bit shift register and a combinatorial logic network that implements the equations used in the encoder 22 to generate the parity bits $P_1$, $P_2$, ..., $P_r$. Alternatively, the copy 38 could be an L-bit shift register and a $2^L$-entry look-up table stored in an electronic memory. In either case, $2^L$ postulates are generated by the copy 38 and compared directly to the received parity bit stream by a comparator 39.

The (L–1)-bit state numbers in storage elements 34 represent all but one bit of the possible contents of the encoding shift register 24. The L-th bit represents the next bit to be decoded, and can be either ZERO or ONE. Both possibilities are tested in conjunction with all possible combinations of the other-bits represented by the state numbers. Thus, all $2^L$ possible bit combinations are tested by the decoder, and a running confidence factor, the path metric 35, is stored for evaluating the correlation between the postulated bit sequence and the received parity bit sequence.

The steps of the SMLSE algorithm are generally as follows for the rate ½ code having a constraint length of five.

Step 1. For the first state, numbered 0000, it is postulated that the new bit is also a ZERO. The postulate 00000 is thus applied to the copy 38 to obtain the two parity bits $P_1(00000)$ and $P_2(00000)$ that would be expected. In this way, the postulate information is encoded using the same parity equations that were used in the encoder 22 shown in FIG. 1.

Step 2. The actual parity bits received $P_1$(actual) and $P_2$(actual) are compared with the postulated parity bits $P_1(00000)$ and $P_2(00000)$ by the comparator 39. The comparison has one of the following results: a match for both bits; a match for one of the two bits and a mismatch for the other of the two bits; or a mismatch for both bits. If both $P_1(00000)$ and $P_2(00000)$ match the actual parity bits received $P_1$(actual) and $P_2$(actual), the value ZERO is added by an adder 36 to the path metric that is associated with the state 0000 and that may be represented by Gp=(0000). Similarly, if there is only a single match, the value one is added to Gp=(0000). If neither $P_1(00000)$ nor $P_2(00000)$ match the actual parity bits received $P_1$(actual) and $P_2$(actual), the value two is added to Gp=0000). In this way, the path metric value for any given state represents the cumulative mismatch between the postulated and actual bit sequences for the particular state. The larger the cumulative mismatch for a state, the larger the path metric value and the smaller the running confidence factor for that state.

Step 3. Steps 1 and 2 are repeated for state 1000. With the new fifth bit postulated to be a ZERO, the pattern 10000 is applied to the copy 38, and its output bits $P_1(10000)$ and $P_2(10000)$ are compared to the actual received bits $P_1$(actual) and $P_2$(actual). The path metric for state 1000, designated Gp=(1000), is updated as in step 2 based upon comparisons of $P_1$(actual) and $P_2$(actual) with $P_1(10000)$ and $P_2(10000)$.

Step 4. The updated path metrics for states 0000 and 1000, i.e., Gpm(0000) and Gp=(1000), are compared by a comparator 37. Whichever state has the lower path metric, and hence the lesser mismatch becomes the new state 0000 when the bit patterns 10000 and 00000 produced by the copy 38 are left-shifted one bit position and the leftmost bit shifts over into the respective bit history in storage elements 33, leaving 0000 in both cases.

Figure 3:
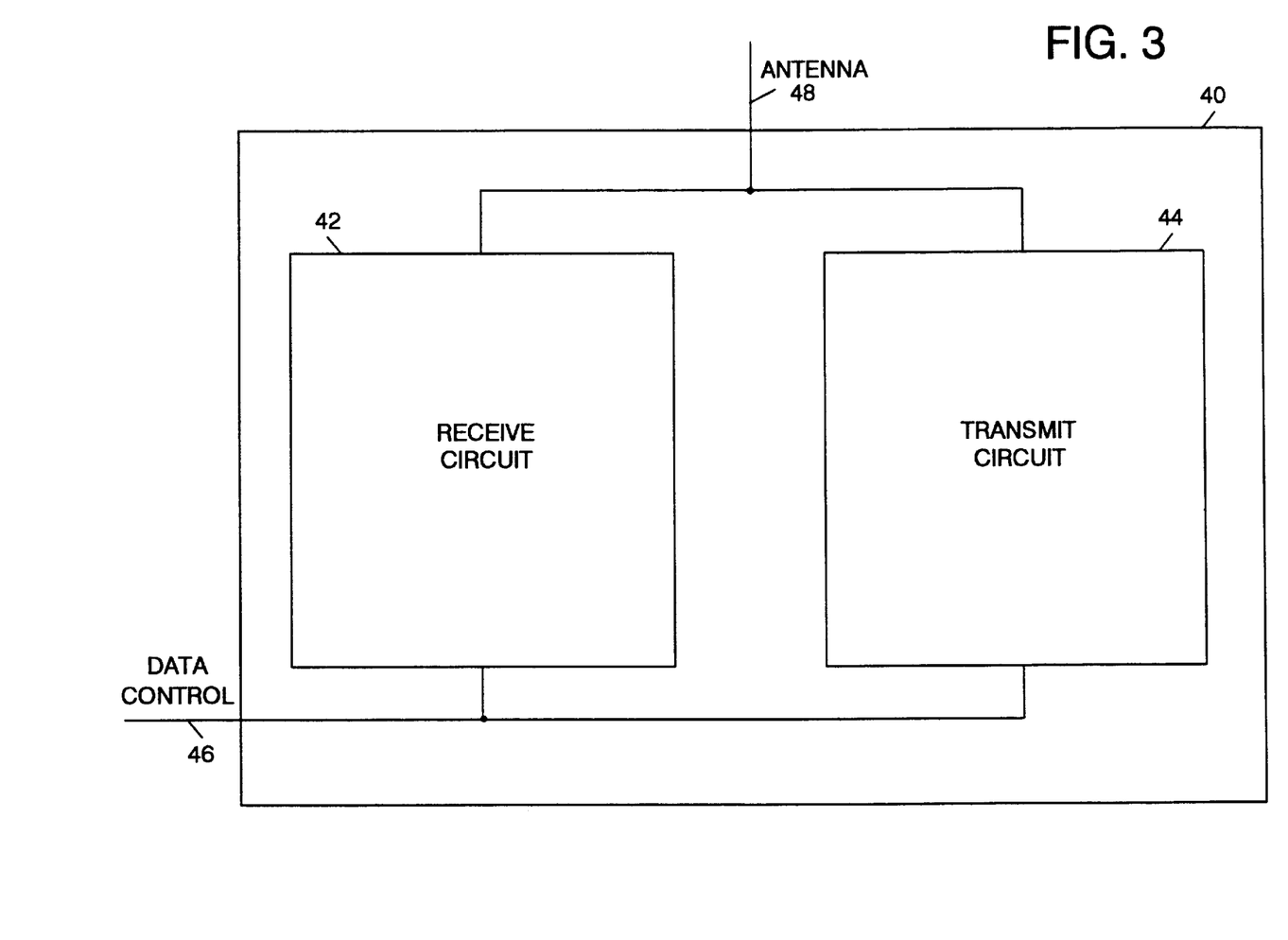
FIG. 3 is a schematic block diagram of an embodiment of a communication system of the present invention.

Thus, either of the states 1000 or 0000 can be the predecessor to the next state 0000 in the case where the new bit is a 0. Depending on which state survives because it has the lowest path metric, the leftmost bit that drops out of the encoder copy 38 pattern to become the rightmost bit of the bit-history 33 for the next state 0000 will be either a 0 or a 1. Moreover, the other corresponding bits in the new bit-history memory 33 are copied over from the surviving selected state, overwriting the bits of the non-survivor, the state that was not selected. For example, as shown in FIG. 3, if the path metric Gp=(1000) is 1.8 and the path metric Gpm(0000) is 9.5, state 1000 is selected to survive and the left-shifted bits 10110111 are overwritten into the bit-history 33 for the new state 0000.

Step 5. Steps 1–4 are repeated with the postulate that the new bit is a ONE. The postulates 00001 and 10001 for the actual received bits are thus respectively applied to the copy 38 to obtain the pairs of parity bits, $P_1(00001)$, $P_2(00001)$ and $P_1(10001)$, $P_2(10001)$, that would be expected. These parity bit pairs are compared with the actual received parity bits $P_1$(actual) and $P_2$(actual), leading to updated path metrics Gp=(0000) and Gp=(1000) which are then compared. This results in a new state 0001 which also has possible predecessor states 0000 and 1000.

Step 6. Steps 1–5 are repeated for every other pair of predecessor states: 0001 and 1001 (resulting in new states 0010 and 0011); 0010 and 1010 (resulting in new states 0100 and 0101); 0011 and 1011 (resulting in new states 0110 and 0111); 0100 and 1100 (resulting in new states 1000 and 1001); 0101 and 1101 (resulting in new states 1010 and 1011); 0110 and 1110 (resulting in new states 1100 and 1101); and 0111 and 1111 (resulting in new states 1110 and 1111).

At the end of the above six steps, two actual received parity bits have been processed and one new decoded bit has been shifted into all of the bit history storage elements 33. These memorized patterns are candidates for the final SMLSE sequence. Because of the way bit histories overwrite other bit histories, when one of a pair of states is selected to survive, the older bits in the storage elements 33 tend towards agreement. If the oldest bits in all bit histories agree, they may be removed as a final decision and the bit history storage elements 33 shortened by one bit.

The algorithm for other rate codes, such as rate ¼, proceeds similarly although four parity bits would be generated by each postulate and compared with four received bits, generating possible increments to the cumulative path metrics of ZERO, one, two, three, or four mismatches.

In another variation of the known algorithm, the received parity bits are characterized not just by their bit polarities, but by a magnitude or quality measure representing the degree of "ONE-ness" or "ZERO-ness". When a mismatch with a locally predicted postulate parity bit is detected, the path metric is penalized by a greater amount if the received bit quality is high and there is therefore less doubt that its sign was in fact correct, than if the quality is low and the received bit polarity was doubtful. This "soft" decoding as opposed to "hard" decoding ideally uses a "soft" bit quality measure that is related to -LOG(Probability) where "probability" is the probability that the bit polarity is correct. When this logarithmic measure is used, the cumulative metric then represents minus the logarithm of the product of all the bit probabilities. The state and bit-history sequence then having the smallest cumulative metric represents the sequence having the highest probability of being right. Usually, the noise is assumed Gaussian, in which case the penalty term can be shown to be proportional to the square of the bit amplitude. The penalization for a mismatch between a locally predicted postulate bit and a received high quality bit may be effected by adding a term proportional to 1/(-LOG(Probability)) to the cumulative logarithmic measure when a mismatch is detected. Such an addition can only substantially affect the measure whenever the probability is high that the received bit polarity is correct and yet a mismatch is detected nonetheless.

Such convolutional coders and decoders can also be built to work with non-binary symbols such as ternary or quaternary symbols.

An SMLSE Viterbi decoder determines the sequence of data bits that most closely explain the received signal. The Viterbi algorithm allows the best sequence to be determined successively thus avoiding the need to test all two-to-the-power of N possible sequences. To establish a starting point for the successive determinations, in some coding schemes, the encoder is initialized to a known starting state before feeding in data bits. In this case, there is only one allowed initial state for the decoder. The number of states then doubles at each successive step up to two to the power of the (code constraint length −1). After this point, the number of states doubles each time a new unknown bit is postulated but immediately halves again due to an earlier-hypothesized bit now being decided to one of two specific values. The number of states thus remains constant until the last unknown data bit is hypothesized. Then, in some coding schemes, known bits are fed into the encoder to flush through the last data bit. When no more data bits are left in the encoder, its output does not depend on data and need not be transmitted. The receiver decoder knows a priori what this terminal state will be and each time one more undecided data bit is flushed out of the encoder, the number of possible remaining states halves until it becomes a single state. This method of terminating a convolutional block encoder by up and down tapering from a single starting state to a single end state is called "using tail bits". The known bits in the encoder at the beginning (or used to flush out the last data bit at the end) give rise to extra transmitted bits. These additional bits that are just used to initialize and terminate the encoder may be avoided by using the alternative method known as tail biting. In tail biting, a number L of data bits is used to initialize the encoder, where L is the number of internal memory elements in the encoder also known as the constraint length. The number of possible starting states is thus $2^L$.

The decoder in this instance assumes all starting states to be possible, not just a single state. The first coded bits transmitted that depend on the first L bits are compared with corresponding predictions at the receiver and a mismatch or path metric is computed for each possibility. Then, one data bit is shifted out of the encoder and a new data bit is shifted in. This halves the number of states but due to the new bit being unknown, the number of predictions and path metric calculations doubles to the same number as before. A Viterbi MSLE machine can be regarded as beginning and ending a cycle at the point where the number of states has halved, and just before a new bit is hypothesized. That way, the number of states and path metrics that have to be stored is $2^{(L-1)}$ rather than $2^L$ although the number of path metric computations is always $2^L$. Using tail biting, after feeding in the last data bit to the encoder, it is flushed through by feeding in the first L−1 data bits again, effectively completing the circle. The receiver can continue around the circle by processing the first signal samples again and continuing until no further change in the decoded output is observed. Alternatively, a tail-biting decoder can continue for a fixed number or fraction of a revolution, at which point the state that has the lowest cumulative path metric is chosen.

Appending a CRC code, as described above, does not come free—it expands the number of coded bits transmitted by the number of CRC bits appended multiplied by the rate of the code. The energy for transmitting the extra bits created by adding the CRC code should be subtracted from the energy used to transmit data if comparison between systems with and without CRC are to be on the basis of equal energy transmitted. Thus, the use of a CRC will generally result in a higher error rate than if no CRC had been used. The errors are, however, detectable.

Prior art methods of adding bits to data to be transmitted, such as the using tail bits method and the CRC code have the further disadvantage of adding additional bits for transmission, with the related costs in energy and transmission rate requirements, generally without providing any improvement in the performance of the error correction decoding operation at the receiving communication system.

Determinate bit error correction coding systems may provide improved error correction decoding but generally are not designed to provide for error detection. In addition, the CRC error detection method generally requires completion of error correction decoding before testing for error detection.

SUMMARY OF THE INVENTION

It is therefore an object of the present invention to provide improved communication systems and methods having both an improved error correction and an error detection capability.

It is a further object of the present invention to provide improved systems and methods of coding data to obtain an error indication during decoding.

It is a further object of the present invention to provide methods and systems for transmitting and receiving a signal in which the receiver has the option of decoding the data without substantial energy penalty and foregoing error detection or of decoding the data with an energy penalty but thereby obtaining an error detection indication.

The communication systems and methods of the present invention intersperse a number of known bits within the data block instead of clumping them at one end. This provides the advantages of being able to successively compute an error check indication during progression of the decoding operation, while providing a more uniform bit error probability over the data bits in the block as compared with the "tail bits" method. Moreover, the extra bits inserted need not cause an increase in data bit error rate, unlike the prior art CRC method. The present invention provides communication systems and methods providing improved error correction decoding while maintaining the benefits of error detection.

In one embodiment of the communication systems and methods of the present invention, a communication system and method is provided having a constrained error correction decoding system providing improved decoding performance by constraining the decoding based on determinate interspersed error detection bits and further provides an error indication based on evaluation of the occasions on which the decoding process is constrained by the determinate error detection bits. The determinate error detection bits may be data dependent or independent of the data in both value and position within the data.

In another embodiment of the communication systems and methods of the present invention error detection bits are interspersed with the data before convolutional encoding and the received encoded message is convolutionally decoded by an unconstrained convolutional encoder and the error detection bits are tested to determine if an uncorrected error was encountered in transmission. The message is also constrained convolutionally decoded based on the determinate error detection bits to provide an improved error correction decoding capability. The output of the unconstrained convolutional decoder may be selected as the received message if no error is indicated. Alternatively, the output of the constrained convolutional decoder is selected as the received message if no error is detected. If an error is indicated, the output of the constrained convolutional decoder may be selected as the received message.

In one embodiment of the communication systems and methods of the present invention transmit and a receive functions are provided. The transmit function includes generating a plurality of determinate error detection bits based on portions of a sequence of data bits to be transmitted and interspersing the determinate error detection bits within the sequence of data bits at a plurality of predetermined positions to provide a message for transmission. The message is convolutionally encoded and transmitted. The receive function includes receiving an encoded message convolutionally decoding the received encoded message. An error indication is generated based on a comparison of the decoded bits of the received encoded message corresponding to the predetermined positions of the determinate error detection bits with predicted error detection bits generated based on decoded bits of the received encoded message corresponding to portions of the received encoded message containing data bits.

In another embodiment of the communication systems and methods of the present invention, the received encoded message is also constrained convolutionally decoded based on a determinate state convolutional decoding process. Predicted error detection bits are generated based on decoded bits of the received encoded message corresponding to portions of the received encoded message containing data bits. Any decoding sequence in which the selected bit in a location corresponding to one of the predetermined locations of the determinate error detection bits does not match the bit value of the corresponding predicted error detection bit is discarded.

In other embodiments of the communications systems and methods of the present invention, the interspersed error detection bits are generated independent of the data bits. Accordingly, the predicted error detections bits need not be generated as a function of the decoded data bits.

DETAILED DESCRIPTION OF THE PREFERRED EMBODIMENTS

The methods and systems for communicating data of the present invention provide the capability of obtaining an error indication without requiring an energy penalty which induces an increased error rate, a capability of providing a constrained determinate state convolutional decoder for improved performance in error correction, or the ability to provide both error detection and improved error correction. The methods and systems of the present invention will now be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Referring now to FIG. 3, a schematic block diagram of a communication system of the present invention is shown. Such a system may be beneficially used for transmitting and receiving a variety of types of information which must be passed through a communication media which has the potential to introduce noise to the transmitted signal before receipt by the receiver. The information transmitted may be digitized voice information, such as with a digital cellular communication system, or some other form of information.

As shown in FIG. 3, communication system 40 includes receive circuit 42 and transmit circuit 44. Receive circuit 42 and transmit circuit 44 interface with a user to provide or receive data or control information as conceptually illustrated at 46. As illustrated in the embodiment in FIG. 3, receive circuit 42 and transmit circuit 44 are both operably connected to antenna 48 to receive and transmit messages from the communications transmission medium. It is to be understood that receive circuit 42 and transmit circuit 44 may also be provided with separate antennas 48. It is also to be understood that each of receive circuit 42 and transmit circuit 44 could be provided with multiple antennas 48 to allow simultaneous transmission and receipt of messages at, for example, various frequencies. It is also to be understood that in the communication system 40 of the present invention other communication systems units 40' (not shown) similarly capable of receiving and transmitting information would be located at remote locations to which communication system 40 would transmit messages and from which communication system 40 would receive messages through the communication transmission medium.

It is to he understood that receive circuit 42 and transmit circuit 44 may be implemented with discrete logic, microprocessor/controllers (or other software executing device), custom or hybrid circuits, memory devices, or a combination of the above or other known hardware for implementing various logic operations as described herein. It is to be further understood that the various blocks of the receive circuit 42 and transmit circuit 44 need not be implemented by separate hardware components but may be combined into single chips or combinations of components.

Figure 4:
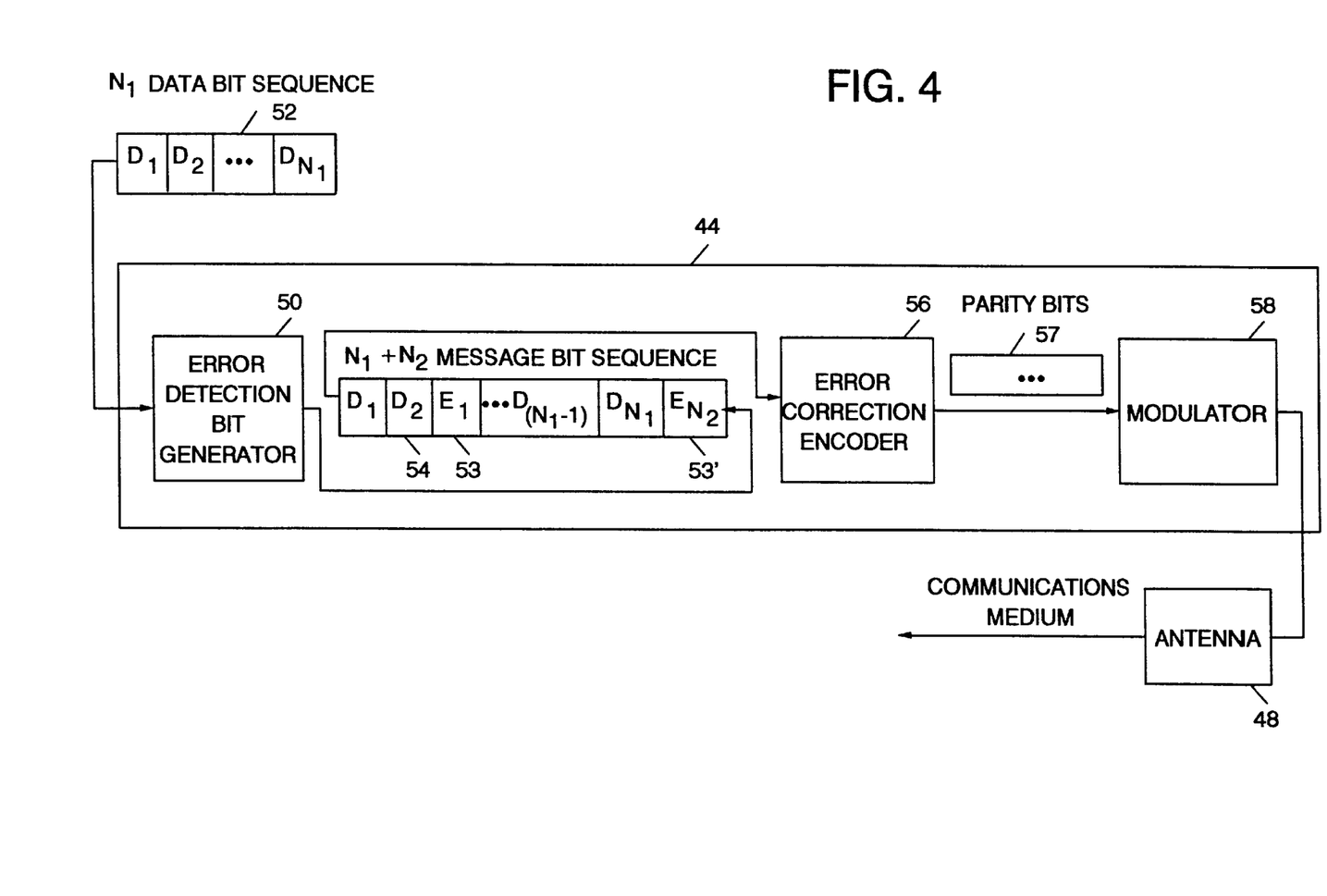
FIG. 4 is a schematic block diagram of an embodiment of the transmit circuit of a communication system of the present invention.

Referring now to FIG. 4, a schematic block diagram of an embodiment of transmit circuit 44 of the present invention is provided. Transmit circuit 44 includes error detection bit generator 50 or other error detection bit generating means for generating a plurality of determinate error detection bits ($E_1 \ldots E_{N2}$) 53, 53' based on portions of a sequence $N_1$ of data bits 52 to be transmitted and for interspersing determinate error detection bits within data bits 52 at a plurality of predetermined positions to provide message bit sequence 54 for transmission. Error detection bit generator 50 may, alternatively, generate a plurality of determinate error detection bits which are data independent. Transmit circuit 44 also includes error correction encoder 56 or other convolutional encoding means responsive to error detection bit generator 50 for encoding message bit sequence 54. Transmit circuit 44 further includes modulator 58 operably connected to antenna 48 or other transmitting means responsive to error correction encoder 56 for transmitting encoded message bit sequence (parity bits) 57 provided by error correction encoder 56. As error correction encoder 56 is a convolutional encoder, the encoded bits are generally referred to as parity bits as described in the Background section above. The output of modulator 58 is provided to antenna 48 for transmission through the communication medium.

While the invention will be described herein as involving sequential transmission of parity bits and sequential receipt of data bits, it is to be understood that the benefits of the invention can likewise be obtained with parallel processing of multiple bit sequences. For example, it would be possible for a rate 2 code to provide transmission of each of the 2 parity bits at separate frequencies concurrently for each incoming shifted message bit. However, it is generally preferred to provide for sequential transmission of parity bits as discussed above in the Background section by providing for a transmission bit rate proportionately greater than the message bit rate.

Referring again to FIG. 4, as illustrated at 52, a sequence of $N_1$ data bits is provided to error detection bit generator 50. The data bits are represented by the sequence of $D_1, D_2, \ldots, D_{N1}$. As described herein, data bits will be considered as binary bits which can have a value of either ONE or ZERO. However, it will be understood that the benefits of the present invention could also be achieved using non-binary symbols such a ternary or quaternary symbols.

Error detection bit generator 50 intersperses a number $N_2$ of error detection bits 53, 53' into sequence of $N_1$ data bits 52 to provide message bit sequence 54. The inserted $N_2$ error detection bits 53, 53' are represented as $E_1, \ldots E_{N2}$. As illustrated in FIG. 4 at message 54, error detection bits 53, 53' may be inserted in a regular pattern such as, for example, after every two data bits as illustrated in FIG. 4. However, it is not necessary that the error bits be inserted in uniform positions so long as the error bits are inserted into message 54 at predetermined positions.

The inserted $N_2$ error detection bits 53, 53' may be functions of subsets of the $N_1$ data bits 52 or may be independent of the $N_1$ data bits 52 or a combination. For example, error detection bits 53, 53' may be provided as all ONEs, all ZEROs, or a combination of ONEs and ZEROs. The $N_2$ error detection bits 53, 53' may also be a function of subsets of $N_1$ data bits 52. As illustrated in FIG. 4, error detection bit $E_1$ 53 may be a function of data bits $D_1$ and $D_2$. For example, $E_1$ could be calculated as the exclusive OR function of $D_1$ and $D_2$. It is also possible that the placement of error detection bits 53, 53' may be determined as a function of data bits 52. Regardless of the method used for determining error detection bits 53, 53', it is necessary that transmit circuit 44 of communication system 40 and receive circuit 42' (not shown) of communication system 40' (not shown) to which message 54 is being transmitted must have agreed on the method of determining the value of error detection bits 53, 53' and their placement.

It should also be understood that while the invention is illustrated in FIG. 4 as having single error detection bits 53, 53' interspersed within the data, error detection bits 53, 53' may also be inserted two or more bits together at different placement points. In addition, as described above, when error detection bits 53, 53' are made functions of subsets of the data bits 52, the data dependent error detection bit 53, 53' have been illustrated as being provided to error correction encoder 56 immediately after the data bits 52 on which it depends (i.e., $E_1$ is immediately after $D_1$ and $D_2$ in message bit sequence 54), it is not necessary that the message bits 54 be provided in this order to obtain the benefits of the present invention. However, as will be described further herein, in embodiments of the present invention, additional benefits may be obtained by providing error detection bits 53, 53' following the data bits 52 upon which they depend as illustrated in FIG. 4.

The augmented block of $N_1+N_2$ message bits 54 is provided to error correction encoder 56. As described in the Background section above, the convolutional encoding process expands the number of bits for transmitting based upon the rate of the convolutional code used. For example, a rate 2 code would double the number of bits to be transmitted. Since the $N_1$ data bits 52 have been increased by $N_2$ error detection bits 53, 53' by error detection bit generator 50, a rate r code, without puncturing, would result in $r(N_1+N_2)$ parity bits being generated by encoder 56 for transmission. However, the augmented block of $N_1+N_2$ bits may be expanded to $rN_1$ bits by using a code, punctured if necessary, of rate $rN_1/(N_1+N_2)$.

Puncturing is done when the use of a rate r code, r being a simple integer, or ratio of simple integers, would yield more than the desired number of $rN_1$ coded bits. In this case, the extra number of bits created by the $N_2$ error detection bits 53, 53' would be $rN_2$. Therefore, $rN_2$ parity bits are deleted by puncturing. To maintain roughly equal error probability after decoding for all bits, the parity bits that are punctured can be chosen to lie around the area where the extra $N_2$ error detection bits 53, 53' are inserted into message 54. Thus, by removing by puncturing some coded (parity) bits that depend on certain data bits, but adding back some bits (error detection bits 53, 53') that depend in a different way on those data bits, the overall performance of the code may be maintained for the affected data bits.

Parity bits 57 are provided by error correction encoder 56 to modulator 58 for conversion to a form suitable for passing through the communications transmission medium, for example, a radio channel.

Figure 5:
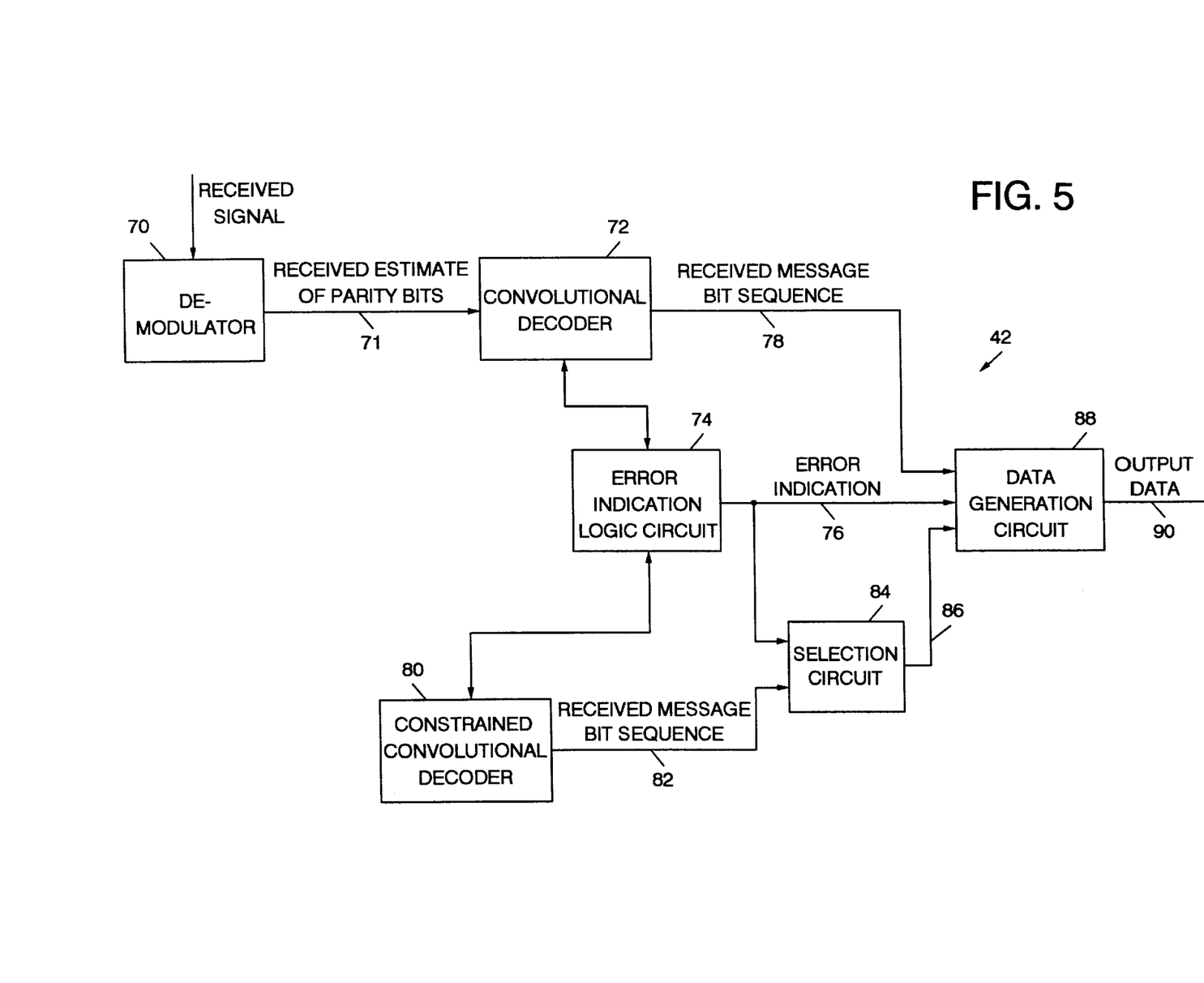
FIG. 5 is a schematic block diagram of an embodiment of a receive circuit of a communication system of the present invention.

Referring now to FIG. 5, a schematic block diagram of an embodiment of receive circuit 42 of the present invention is provided. Receive circuit 42 includes demodulator 70 operably connected to antenna 48 (illustrated in FIG. 3) or other receiving means for receiving an encoded message over the communications transmission medium (for example, a radio channel) to provide the received encoded message as estimates of the transmitted parity bits 71. These estimates may be "hard" decisions (binary ONEs or ZEROs) or "soft" decisions which preferably are estimates of the logarithm of the probability that a parity bit is respectively a ONE or a ZERO.

The hard (or soft) parity bit information is then passed to convolutional decoder 72 or other convolutional decoding means responsive to demodulator 70 for decoding estimates of parity bits 71. In the embodiment to be described herein, convolutional decoder 72 is a Viterbi SMLSE convolutional decoder which may operate generally according to the description of such a decoder as described in the Background section except as described herein.

Receive circuit 42 also includes error indication logic circuit 74 or other error indication generating means responsive to convolutional decoder 72 for generating an error indication based on a comparison of the decoded bits of the received encoded message (estimates of parity bits) 71 corresponding to the predetermined positions of the determinate error detection bits 53, 53' with predicted error detection bits (not shown) generated by error indication logic circuit 74. An error may be indicated if any mismatch occurs or, alternatively, based on an error count or some other criteria for generating an error indication based on detected errors. In the embodiments of the present invention having error detection bits 53, 53' which are generated as a dependent function of subsets of data bits 52, the predicted error detection bits are generated based on decoded bits of the received encoded message 71 corresponding to portions of the received encoded message 71 containing data bits. When error detection bits 53, 53' are not data dependent, error indicator logic circuit 74 determines the expected value for error detection bits 53, 53' in each predetermined position based upon the agreed upon pattern of error detection bits 53, 53' shared with the transmitting communications system 40' (not shown) at which the message originated.

Convolutional decoder 72 may, as with known Viterbi SMLSE decoders as illustrated in FIG. 2, include memory for storing postulate bit states 34, a history of selected bits for each of the postulate bit states 33 and a confidence factor or metric 35 for each of the postulate bit states 34. Convolutional decoder 72 may also include a copy of the encoder 38 and a comparator 39 for comparing postulated parity bits for candidate states with the received estimates of the transmitted parity bits 71. Metric 35 is then updated for each possible state based on the history of matches and mismatches between the postulated parity bits and the received estimates of the parity bits.

As will be described more fully below in connection with the description of the methods of the present invention, error indication logic circuit 74 receives the decoded data and error detection bits from convolutional decoder 72 and generates an error indication 76. In the embodiment of the present invention illustrated in FIG. 5, error indication logic circuit 74 is also operably connected to constrained convolutional decoder 80. For each received estimate of parity bits sequence 71, convolutional decoder 72 generates a $N_1+N_2$ bit received candidate message bit sequence 78. Received candidate message bit sequence 78 is the surviving best candidate sequence from the Viterbi SMLSE decoding process of convolutional decoder 72 corresponding to the transmitted $N_1+N_2$ bit message bit sequence 54.

Similarly, constrained convolutional decoder 80 for each $N_1+N_2$ bit message bit sequence 54 transmitted, provides received candidate message bit sequence 82 which represents the single remaining candidate message resulting from the constrained convolutional decoding process of the present invention. It is to be understood from the description of the methods of the present invention herein that receive circuit 42 may include both convolutional decoder 72 and constrained convolutional decoder 80. Receive circuit 42 may also include only convolutional decoder 72 or only constrained convolutional decoder 80.

In one embodiment of the present invention as illustrated in FIG. 5, error indication 76 and received message bit sequence 82 are provided to selection circuit 84 or other selection means. If error indication 76 indicates that no error has been detected, received message bit sequence 82 is selected as the correct received message bit sequence 86. Correct received message bit sequence 86, or, where no constrained convolutional decoder 80 is used, received message bit sequence 78 is then provided to data generation circuit 88 or other means for separating data and error detection bits where the received error detection bits ($E_1$ . . . $E_{N2}$) are removed to provide output data 90 when error indication 76 indicates that no error has been detected in the decoded received message.

Figure 6:
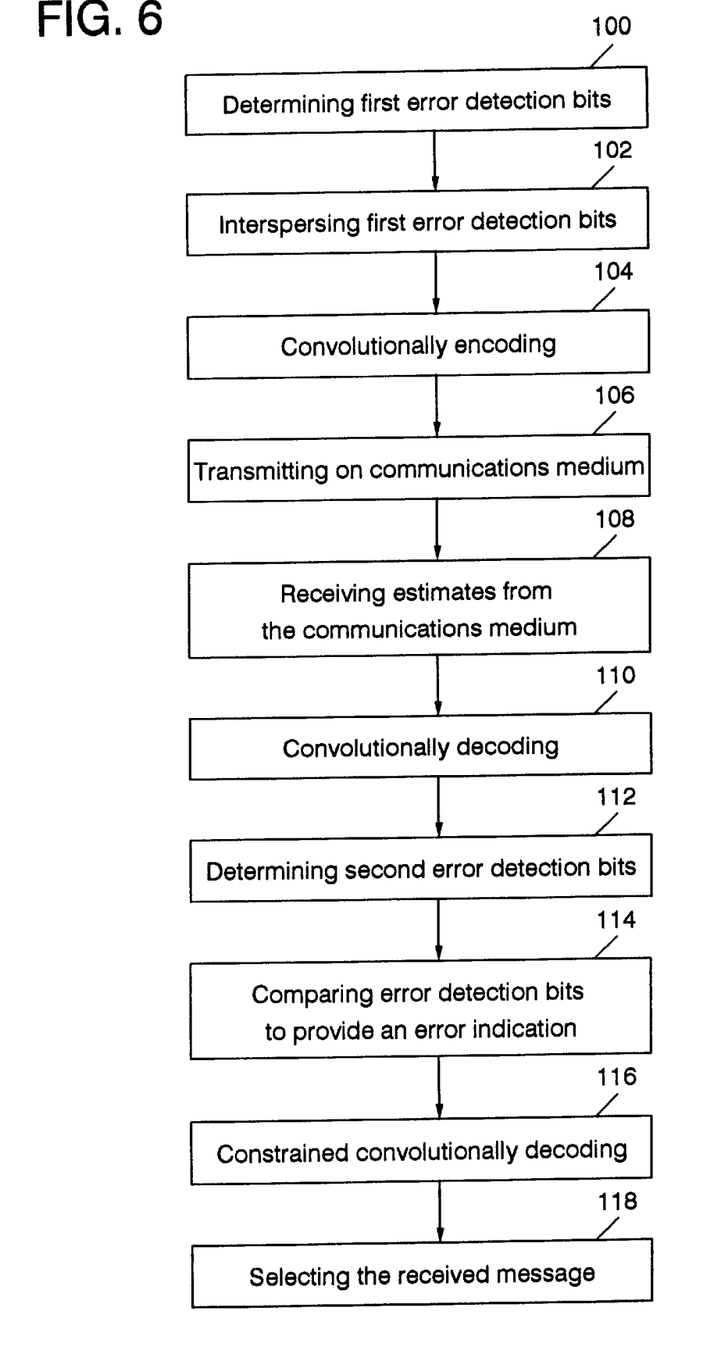
FIG. 6 is a flowchart illustrating operations of an embodiment of communicating data bits of the present invention.

Referring now to FIG. 6, a flow chart illustrating operation of an embodiment of the present invention is provided. Operations may be performed by hardware, software or a combination thereof to provide systems and methods according to the invention. Operations are illustrated in FIG. 6 for a user-provided sequence of $N_1$ data bits 52. At block 100, error detection bit generator 50 determines first error detection bits 53, 53' using a predetermined function which is known by both the transmitting communication system and an intended target receiving communication system. As described previously, at block 100, the error detection bits may be determined as a function which is data independent or as a function which is dependent on a subset of data bits 52.

Where the error detection bits are data dependent, the operation at block 100 includes calculating the first error detection bits based upon the predetermined function of the corresponding subset of data bits. At block 102, error detection bit generator 50 intersperses the determined first error detection bits with the data bits in predetermined locations to provide message bit sequence 54.

As described above, the predetermined locations may be fixed in advance or dependent on the data bits. Furthermore, single bits may be interspersed or two or more bits may be interspersed at a plurality of predetermined points within message bit sequence 54. In any event, the error detection bits are interspersed within the data bits rather than appended to the end of the data bits as with the prior art CRC error detection method described in the Background section above.

Message bit sequence 54 is convolutionally encoded by error correction encoder 56 at block 104 to provide a sequence of parity bits representing the encoded message for transmission. At block 106, the provided sequence of parity bits is converted into a form suitable for transmission over the communications medium by modulator 58 and transmitted over the communication medium via antenna 48.

The operations of block 100 through block 106 are executed by transmit circuit 44 of the communications system 40 which is transmitting data to another communication system 40' (not shown). The operations to be described now may be performed by receive circuit 42 of the communication system 40 on a received encoded message which has been received from remote communication system 40' (not shown). As described herein, it is to be understood that the receiving steps acting on the encoded message parity bits transmitted in transmitting block 106 would generally be received and processed by receive circuit 42' (not shown) of communication system 40' (not shown). However, for simplicity of reference to the system elements of the present invention, the message being processed by the following steps will be described as a message received by receive circuit 42 of communication system 40.

At block 108, demodulator 70 of receive circuit 42 receives via antenna 48 estimates of the transmitted parity bits 71 from the communications medium. It is to be understood that the operation of block 108 involves receiving estimates of the transmitted parity bits because the communications medium has the potential to introduce noise which may affect the transmitted parity bits transmitted at block 106 before they are received at block 108. At block 110, convolutional decoder 72 decodes the received estimates of the transmitted parity bits 71 to provide a candidate bit sequence 78 corresponding to message bit sequence 54. The operation of block 110 may use a SMLSE Viterbi algorithm. At block 112, error indication logic circuit 74 determines second error detection bits from the decoded bits generated at block 110 based on the predetermined function used to determine the first error detection bits 53, 53' at block 100. Block 112 may be executed by error indication logic circuit 74 in cooperation with convolutional decoder 72. Where the predetermined function for determining first error detection bits 53, 53' at block 100 is a function of subsets of the data to be transmitted, the operation of block 112 involves calculating second error detection bits from the bits decoded by convolutional decoder 72 in locations expected to contain data bits using the same predetermined function of subsets of the data bits as at block 100.

At block 114, receive circuit 42 compares the second error detection bits determined at block 112 with the decoded bits provided at block 110 which are in locations corresponding to the predetermined locations of first error detection bits 53, 53' to provide error indication 76. For example, an error may be indicated at block 112 if any mismatches are detected. As at block 112, block 114 is executed by error indication logic circuit 74 and convolutional decoder 72.

As described above, it is preferred that the subset of data bits on which each error detection bit depends be transmitted immediately before the corresponding dependent error detection bit. This is desirable in an embodiment of the present invention wherein block 112 and block 114 may be performed whenever a bit is decoded at block 110 which corresponds to a predetermined location of a first error detection bit 53, 53' so that block 114 may provide an error indication before the convolutional decoding operation at block 110 is completed. This allows decoding to be terminated immediately upon detection of a data transmission error which allows for an increase in battery life of communication system 40. This is a desirable feature for applications of the present invention, such as mobile cellular phones, where communication system 40 may be operated for extended periods of time on battery power.

Optionally, in an embodiment of the present invention, constrained convolutional decoder 80 in cooperation with error indication logic circuit 74 performs a constrained convolutional decoding of the received estimates of the transmitted parity bits 71 at block 116, using the determinate state convolutional decoding process of the present invention. The operation at block 116, provides a second candidate bit sequence 82 having bits in locations corresponding to the predetermined locations of first error detection bits 53, 53' selected while decoding based on the predetermined function used to generate first error detection bits 53, 53' at block 100. The bits at the predetermined locations are constrained to equal values computed using the predetermined function of the determining first error detection bits step applied to the received estimates of the transmitted parity bits.

Figure 7:
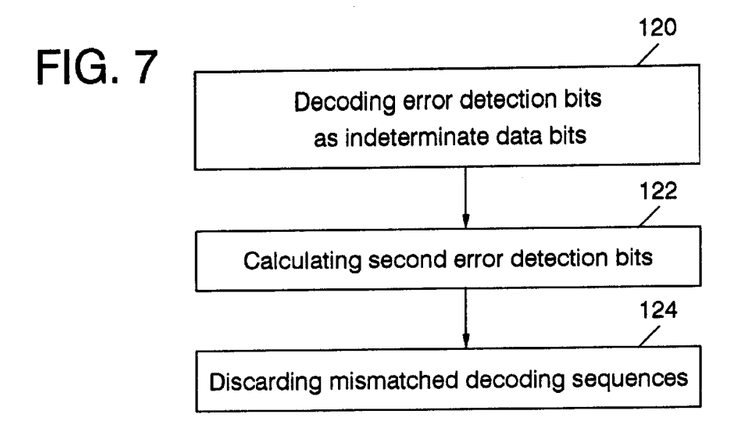
FIG. 7 is a flowchart illustrating operations of an embodiment of the constrained convolutional decoding operation for communicating data bits of the present invention.

Referring now to FIG. 7, an embodiment of a constrained convolutional decoding operation of block 116 is illustrated by a flowchart. At block 120, constrained convolutional decoder 80 decodes bits in locations corresponding to the predetermined locations of first error detection bits 53, 53' as indeterminate bits (i.e., like data bits). At block 122, error indication logic circuit 74 in cooperation with constrained convolutional decoder 80 calculates second error detection bits from the decoded bits provided by constrained convolutional decoder 80 at block 110 which are in locations expected to contain data bits using the predetermined function of subsets of the data bits used at block 100.

As illustrated in FIG. 7, first error detection bits 53, 53' are data dependent bits determined based on a function of subsets of the data bits. It is to be understood, however, that this invention also encompasses predetermined error detection bits interspersed within data bits which are not functions of subsets of the data bits. Where data independent error detection bits are used, the operation at block 122 involves determining second error detection bits based upon the agreed upon predetermined function for determining first error detection bits used at block 100 and need not be based upon a calculation linked to subsets of the data bits as described above for block 122.

At block 124, receive circuit 42 discards any ongoing decoding sequence in which the selected bit in a location corresponding to one of the predetermined locations of first error detection bits 53, 53' does not match the calculated value of the corresponding second error detection bit. In this manner, constrained convolutional decoder 80 ultimately provides a second candidate bit 82 at block 116 in which the error correction decoding process has been constrained to favor paths selecting the bit value for the determinate bit locations which is believed to be the value transmitted to communication system 40.

However, one limitation which may be encountered is if constrained convolutional decoder 80 executing a constrained convolutional decoding at block 116 operates on a message having uncorrectable errors which occurred in the transmission of data. By forcing the resulting second candidate bit sequence 82 to take on the correct values for the inserted error detection bits at block 116, the resulting decoded sequence 82 will have masked out the incorrect inserted error detection bits and, therefore, masked out the indicated error in transmission.

Consequently, at block 118 in the illustrated embodiment of the present invention utilizing the optional constrained convolutional decoding operation at block 116, the second candidate bit sequence 82 from block 116 may be selected as the received message if no error is indicated at block 114. Alternatively, the first candidate bit sequence 78 may be selected as the received message if no error is indicated as both candidate bit sequences would be expected to be the same. If an error is indicated at block 114, second candidate bit sequence 82 may be selected as the received message as it may provide an improved estimate of the received message. Block 114 operates responsive to the non-constrained convolutional decoding output at block 110. In this manner, both an improved convolutional decoding output may be provided at block 116, benefiting from the determinate values of the inserted error detection, bits while maintaining the error detection indication capability so that when uncorrectable errors are encountered in communications, the receiving communication system 40 will be able to determine that such errors have occurred.

Figure 8:
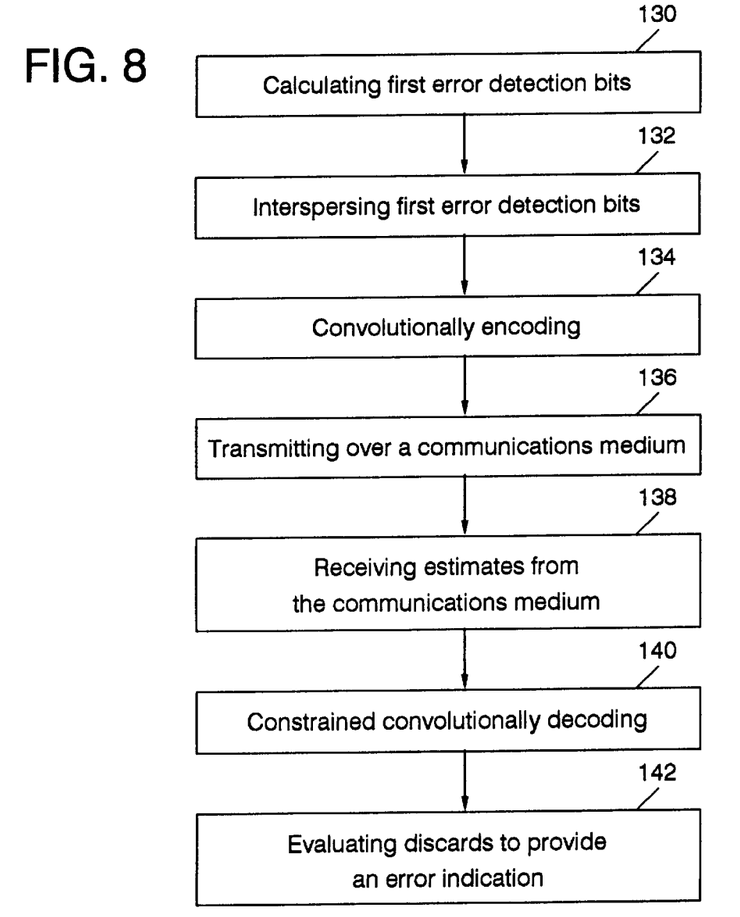
FIG. 8 is a flowchart illustrating operations of another embodiment for communicating data bits of the present invention.

Another embodiment of the present invention is illustrated in the flowchart of FIG. 8. The embodiment illustrated in FIG. 8 provides both the benefits of the constrained convolutional decoding method of the present invention as well as an error detection indication without the need for having convolutional decoder 72 as well as convolutional decoder 80 as illustrated in FIG. 5. At block 130, error detection bit generator 50 calculates first error detection bits 53, 53' as a predetermined function of subsets of the data bits. At block 132, error detection bit generator 50 intersperses first error detection bits 53, 53' with the data bits in predetermined locations to provide message bit sequence 54. At block 134, error correction encoder 56 convolutionally encodes message 54 to provide parity bits 57 representing the encoded message for transmission. At block 136, modulator 58 transmits the provided parity bits 57 over the communication medium via antenna 48.

As with the description of the method in connection with FIG. 6, it is to be understood that the transmit and receive operation are generally between communication system 40 and a remote communication system 40' (not shown). However, for purposes of relating the operations described herein to the block diagrams already described, the following operations which represent the receive side will be described for a message which has been received by communication system 40.

At block 138, receive circuit 42 receives the transmitted parity bits via antenna 48 and demodulator 70 demodulates the bits to provide estimates of the parity bits 71. At block 140, constrained convolutional decoder 80 decodes the estimates of the transmitted parity bits 71 using the determinate state convolutional decoding process described previously in connection with FIG. 7, to provide a candidate bit sequence 82 having bits in locations corresponding to the predetermined locations of first error detection bits 53, 53' selected while decoding using the predetermined function of subsets of the data bits of block 130.

However, in the embodiment of the present invention illustrated in FIG. 8 at block 142, the number of times any decoding sequence was discarded at block 124, is evaluated to provide an error indication. In other words, the number of times that the determinate bit limitation on the convolutional decoding process forced decisions which would not have otherwise been the selected decoding sequence path of the unconstrained convolutional decoding algorithm provides an indication of how many times the decoding operation at block 140 had to be "pulled back" to the "correct" state. A large number of occasions on which the decoding process had to be "pulled back" by the constraint indicates a likelihood that an uncorrectable error has been encountered which was simply masked by forcing the decoding operation at block 140 to select a candidate bit sequence which indicates no error has been detected.

While FIG. 8 illustrates an embodiment of the present invention using only a constrained convolutional decoder where error detection bits 53, 53' are data dependent functions of subsets of the data bits, it is to be understood that, as with the embodiment of FIG. 6, the benefits of the present invention may likewise be obtained where the predetermined error detection bits 53 53' are not data dependent. In this case, the operation at block 130 merely involves determining first error detection bits 53, 53' as a predetermined function independent of the data bits. Likewise, the constrained convolutional decoding operation at block 140 is based upon the data independent predetermined function and not a function of subsets of the data bits.

In the embodiment of the method of the present invention illustrated in FIG. 8, the decoder has been allowed to test only data sequences conforming to the encoding process, which is the most energy efficient means to transmit and receive data. Nevertheless, the extra bits inserted were able to provide an error indication as when the less energy efficient prior art method of decoding CRC's is used.

In the drawings and specification, there have been disclosed preferred embodiments of the present invention and, although specific terms are employed, they are used in a generic and descriptive sense only and not for the purposes of limitation, the scope of the invention being set forth in the following claims:

We claim:

1. A method of communicating data bits, comprising the steps of:

selecting from the data bits to be communicated a sequence of data bits to be convolutionally encoded together;

determining first error detection bits using a predetermined function;

interspersing the first error detection bits within the sequence of data bits in a plurality of predetermined spaced locations to provide a message;

convolutionally encoding the message to provide parity bits representing the encoded message for transmission;

transmitting the parity bits over a communications medium;

receiving estimates of the transmitted parity bits from the communications medium;

convolutionally decoding the estimates of the transmitted parity bits to provide a candidate bit sequence corresponding to the message;

determining second error detection bits from the candidate bit sequence based on the predetermined function; and comparing the second error detection bits with the bits of the candidate bit sequence in locations corresponding to the predetermined locations of the first error detection bits to provide an error indication.

2. A method of communicating data bits according to claim 1, wherein said step of determining first error detection bits comprises the step of determining first error detection bits for the block of data bits using a predetermined data independent function.

3. A method of communicating data bits according to claim 1, wherein said step of determining first error detection bits includes the step of calculating each of the first error detection bits as a predetermined function of a different subset of the sequence of data bits to provide data dependent first error detection bits and wherein said determining second error detection bits step includes the step of calculating second error detection bits from the bits of the candidate bit sequence in locations expected to contain data bits using the same predetermined function of subsets of data bits of the sequence of data bits as used by said step of determining first error detection bits.

4. A method of communicating data bits according to claim 1, wherein said determining second error detection bits step and said comparing step are performed when a bit is decoded in said convolutionally decoding step which corresponds to a predetermined location of a first error detection bit to provide an error indication before said convolutionally decoding step is completed.

5. A method of communicating data bits according to claim 1, further comprising the steps of:

constrained convolutionally decoding said estimates to provide a second candidate bit sequence in which bits in locations corresponding to the predetermined locations of the first error detection bits are constrained to equal values computed using the predetermined function of said determining first error detection bits step applied to the received estimates of the transmitted parity bits; and selecting either said first candidate bit sequence or said second candidate bit sequence as the received message.

6. A method of communicating data bits according to claim 5, wherein said selecting step comprises selecting the first candidate bit sequence as the received message if no error is indicated in said comparing step and selecting the second candidate bit sequence as the received message if an error is indicated in said comparing step.

7. A method of communicating data bits according to claim 5, wherein said selecting step comprises selecting the second candidate bit sequence as the received message if no error is indicated in said comparing step.

8. A method of communicating data bits according to claim 1, wherein said constrained convolutionally decoding step includes the steps of:

decoding the bits in locations corresponding to the predetermined locations of the first error detection bits as indeterminate data bits;

calculating second error detection bits from the bits of the candidate bit sequence in locations expected to contain data bits using the predetermined function of subsets of the sequence of data bits of said calculating first error detection bits step; and, discarding any decoding sequence in which the selected bit in a location corresponding to one of the predetermined locations of the first error detection bits does not match the calculated value of the corresponding second error detection bit; and, wherein said method of communicating data further includes the step of, evaluating the number of times a decoding sequence is discarded to provide an error indication.

9. A method of communicating data bits, comprising the steps of:

selecting from the data bits to be communicated a sequence of data bits to be convolutionally encoded together;

calculating first error detection bits as a predetermined function of subsets of the sequence of data bits;

interspersing the first error detection bits within the sequence of data bits in a plurality of predetermined spaced locations to provide a message;

convolutionally encoding the message to provide parity bits representing the encoded message for transmission;

transmitting the parity bits over a communications medium;

receiving estimates of the transmitted parity bits from the communications medium; and, constrained convolutionally decoding the estimates of the transmitted parity bits to provide a candidate bit sequence in which bits in locations corresponding to the predetermined locations of the first error detection bits are constrained to equal values computed using the predetermined function of subsets of the sequence of data bits of said calculating first error detection bits step applied to the received estimates of the transmitted parity bits.

10. A method of communicating data bits according to claim 1, wherein said convolutionally decoding step comprises the step of performing a sequential maximum likelihood sequence estimation prediction of the message to be decoded.

11. The system according to claim 10, further comprising:

constrained convolutional decoding means responsive to said receiving means for decoding said received encoded message based on a determinate state convolutional decoding process, said constrained convolutional decoding means including, means for generating predicted error detection bits generated based on decoded bits of the received encoded message corresponding to portions of the received encoded message containing data bits; and, means for discarding any decoding sequence in which the selected bit in a location corresponding to one of the predetermined locations of the determinate error detection bits does not match the bit value of the corresponding predicted error detection bit.

12. A method of communicating data bits, comprising the steps of:

selecting from the data bits to be communicated a sequence of data bits to be convolutionally encoded together:

interspersing predetermined bits within the sequence of data bits in a plurality of predetermined spaced locations to provide a message;

convolutionally encoding the message to provide parity bits representing the encoded message for transmission;

transmitting the parity bits over a communications medium;

receiving estimates of the transmitted parity bits from the communications medium; and, constrained convolutionally decoding the estimates of the transmitted parity bits using a determinate state convolutional decoding process to provide a candidate bit sequence having bits constrained to the state of the predetermined bits from said interspersing step in locations corresponding to the predetermined locations of the predetermined bits by discarding any decoding sequence in which the selected bit in a location corresponding to one of the predetermined locations of the predetermined bits does not match the state of the corresponding predetermined bit; and, accumulating the number of times a decoding sequence is discarded to provide an error indication.

13. The system according to claim 11, wherein said convolutional decoding algorithm is a sequential maximum likelihood sequence estimation technique.

14. The system according to claim 13, wherein said decoder includes memory for storing postulate bit states, a history of selected bits for each of said postulate bit states, and a confidence factor for each of said postulate bit states.

15. A communications system, comprising:

means for selecting from the data bits to be communicated a sequence of data bits to be convolutionally encoded together;

error detection bit generating means for generating a plurality of determinate error detection bits based on portions of the sequence of data bits and for interspersing said determinate error detection bits within said sequence of data bits at a plurality of predetermined spaced positions to provide a message for transmission;

convolutional encoding means responsive to said error detection bit generating means for encoding said message;

transmitting means responsive to said convolutional encoding means for transmitting said encoded message;

receiving means for receiving an encoded message;

convolutional decoding means responsive to said receiving means for decoding said received encoded message; and, error indication generating means, responsive to said convolutional decoding means, for generating an error indication based on a comparison of the decoded bits of the received encoded message corresponding to the predetermined positions of the determinate error detection bits with predicted error detection bits generated based on decoded bits of the received encoded message corresponding to portions of the received encoded message containing data bits.

16. A communications system, comprising:

means for selecting from the data bits to be communicated a sequence of data bits to be convolutionally encoded together;

error detection bit generating means for generating a plurality of determinate error detection bits and interspersing said determinate error detection bits within the sequence of data bits at a plurality of predetermined spaced positions to provide a message for transmission;

convolutional encoding means responsive to said error detection bit generating means for encoding said message;

transmitting means responsive to said convolutional encoding means for transmitting said encoded message;

receiving means for receiving an encoded message;

convolutional decoding means responsive to said receiving means for decoding said received encoded message; and, error indication generating means responsive to said convolutional decoding means for generating an error indication based on a comparison of the decoded bits of the received encoded message corresponding to the predetermined positions of the determinate error detection bits with predicted error detection bit values.

17. The system according to claim 13, further comprising:

constrained convolutional decoding means responsive to said receiving means for decoding said received encoded message based on a determinate state convolutional decoding process, said constrained convolutional decoding means including, means for determining expected error detection bits based on expected values of said determinate error bits for locations corresponding to said predetermined positions of the determinate error detection bits; and, means for discarding any decoding sequence in which the selected bit in a location corresponding to one of the predetermined locations of the determinate error detection bits does not match the bit value of the corresponding expected error detection bit.

* * * * *

UNITED STATES PATENT AND TRADEMARK OFFICE
CERTIFICATE OF CORRECTION

PATENT NO. : 5,910,182
DATED : June 8, 1999
INVENTOR(S) : Paul W. Dent; Rajaram Ramesh It is certified that error appears in the above-identified patent and that said Letters Patent is hereby corrected as shown below:

In Claim 8, please change the dependency from "Claim 1" to --Claim 9--;

In Claim 11, please change the dependency from "Claim 10" to --Claim 15--; and

In Claim 17, please change the dependency from "Claim 13" to --Claim 16--.

Signed and Sealed this

Eleventh Day of January, 2000

Attest:

Attesting Officer

Q. TODD DICKINSON

Acting Commissioner of Patents and Trademarks